Oct. 30, 1962 | A. BLAIN | 3,061,761

CIRCUIT PACK ASSEMBLY

Filed June 10, 1958 | 2 Sheets-Sheet 1

INVENTOR.
ALBERT BLAIN
BY
Trachtman + Zoda
ATTORNEYS.

Oct. 30, 1962 A. BLAIN 3,061,761

CIRCUIT PACK ASSEMBLY

Filed June 10, 1958 2 Sheets-Sheet 2

INVENTOR.
ALBERT BLAIN
BY
Trachtman + Zoda
ATTORNEYS.

United States Patent Office 3,061,761

Patented Oct. 30, 1962

3,061,761

CIRCUIT PACK ASSEMBLY

Albert Blain, Philadelphia, Pa., assignor to General Atronics Corporation, Bala-Cynwyd, Pa., a corporation of Pennsylvania Filed June 10, 1958, Ser. No. 741,118
8 Claims. (Cl. 317—101)

The invention relates to a circuit pack assembly, and more particularly an assembly for detachably securing and electrically connecting a plurality of assembled units in the form of circuit packs.

Heretofore, the use of printed circuit techniques in electronic systems have made it necessary, in many instances, to divide the circuits into sections for placement on cards. These cards each have a terminal portion which is designed for insertion into a connector having many contacts. Because of the force required for inserting and removing the cards, the number of terminals and thus the size of the cards have been limited. This has made it necessary to break up and separate the components of a circuit onto a number of cards, even though the components must always have a fixed relationship to each other. This has also prevented direct wiring from one card to another, thereby increasing the number of terminals needed and requiring an indirect path.

It is therefore an object of the invention to provide a new and improved circuit pack assembly which will greatly increase the number of components which may be mounted and connected together, while still allowing the use of circuit boards and connectors.

Another object of the invention is to provide a new and improved circuit pack assembly allowing direct interconnection between various components supported thereby.

Another object of the invention is to provide a new and improved circuit pack assembly which is highly efficient in operation and allows reduction in manufacturing costs.

Another object of the invention is to provide a new and improved circuit pack assembly allowing the easy connection and removal of a circuit pack from an assembly.

Another object of the invention is to provide a new and improved circuit pack which may readily be fabricated by utilizing substantially standard circuit boards and may be adapted to support and directly interconnect related components supported by the several boards.

Another object of the invention is to provide a new and improved circuit pack assembly allowing the ready removal and replacement of packs of high capacity for programming and changing the nature of the assembly.

The above objects as well as many other objects of the invention are achieved by providing a circuit pack assembly comprising a circuit pack having a plurality of circuit board members of substantially rectangular form. Each of the members has first and second ends, and top and bottom edges, with the bottom edges provided with a plurality of electrical contact portions. Binding means for the circuit boards comprise first and second retaining units respectively engaging the first and second ends of the members and includes means extending between and securing together the retaining means. The binding means secures the plurality of members in spaced parallel relation to one another with their contact segments along their bottom ends.

A connecting unit is provided with a plurality of parallel spaced grooves for detachably receiving retained respective bottom edge portions of the members of the pack. The grooves of the connector unit has a plurality of electrical contact elements which engage respective electrical contact portions of the members when the bottom edges of the members are received within the respective grooves of the connecting unit.

A clamping means comprises a pair of brackets connected at opposite sides of the connector unit for detachably engaging the binding means of said pack for moving into engagement, maintaining in engagement and disengaging the pack with the connector unit.

Other objects and advantages of the invention will in part be obvious and in part be described, when the following specification is read in connection with the drawings, in which.

Like reference numerals designate like parts throughout several views.

Figure 1:
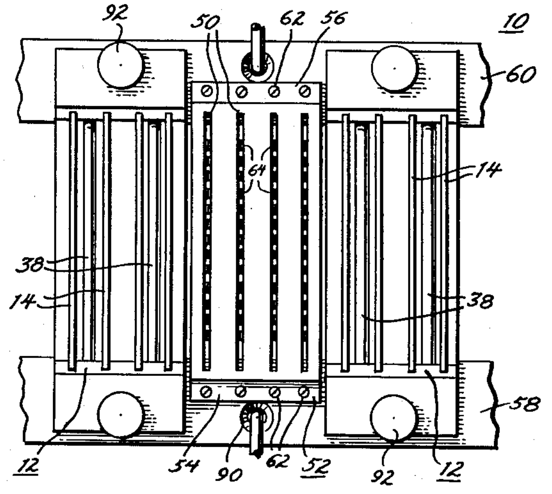
FIGURE 1 is a plan view of a circuit pack assembly embodying the invention.

The FIGURES 1 to 4, inclusive disclose a circuit pack assembly 10 embodying the invention. The circuit pack assembly 10 comprises a circuit pack 12 shown in detail in FIGURES 5 to 7 inclusive.

The circuit pack 12 comprises a plurality of substantially rectangular circuit board members 14 each having top and bottom edge portions 16, 18 (FIGURE 6) and first and second ends 20, 22. As usual, the board is made of an insulating material and has a plurality of electrical contact portions 24 along its bottom edge 18.

A plurality of circuit boards 14 are formed into a circuit pack by being secured together in a fixed relationship with each other by binding means 26 (FIGURES 5, 6 and 7) comprising a pair of retaining units 28, 30. The retaining units 28, 30 are U-shaped and have top and bottom leg portions 32, 34. The leg portions 32, 34 of the retaining units 28, 30 respectively engage the ends 20, 22 of the circuit boards 14, in maintaining them in a parallel relationship to each other. The leg portions 32, 34 of the retaining units 28, 30 and the ends 20, 22 of the board members 14 may be provided with interlocking spaced slots at their contact regions 36 for positively interlocking and retaining the fixed parallel relationship of the members 14.

A pair of spacers 38 (FIGURES 5 and 6) are received between the retaining units 28, 30 and are connected with the retaining units 28, 30 at their opposite ends by screws 40. The spacers 38 and screws 40 of the binding means 26 maintain the retaining units 28, 30 in position, in engagement with the end portions 20, 22 of the plurality of board members 14 comprising the circuit pack 12.

Figure 5:
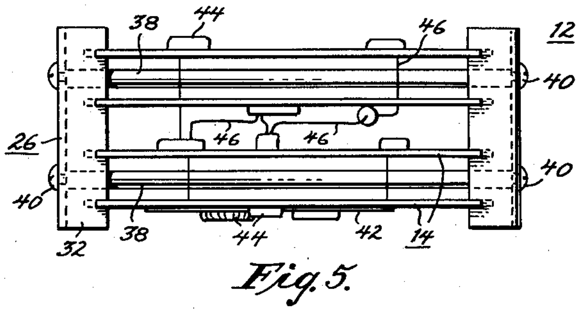
FIGURE 5 is an enlarged view of the circuit pack shown in FIGURE 4.
Figure 6:
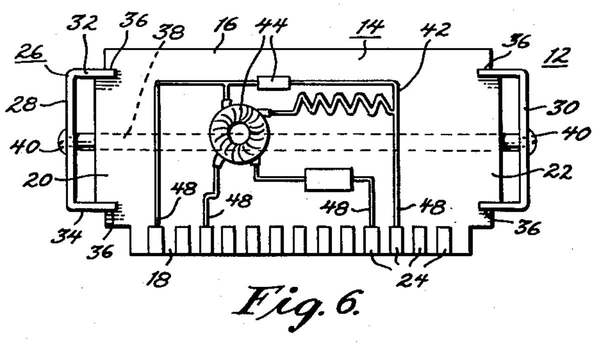
FIGURE 6 is a front elevational view of FIGURE 5.
Figure 7:
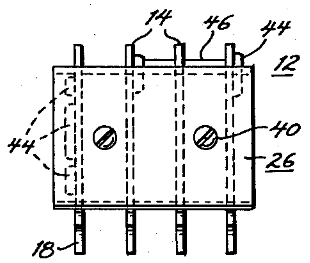
FIGURE 7 is a side elevational view of FIGURE 6.

Each of the circuit board members 14 may be provided in the usual manner with printed circuitry 42 and electrical components 44 mounted thereon and electrically connected with the printed circuitry 42 as shown in FIGURE 6. Since a plurality of circuit boards 14 are assembled and maintained together in the circuit pack 12, interconnections between components mounted on various circuit boards 14 of tne pack 12 and with the printed circuitry of the several members 14 may readily be made by direct wire connections such as by the electrical wire conductors 46 shown in FIGURES 5 and 7. This is possible because of the fixed relationship between the circuit boards 14 of the circuit pack 12. The printed conductor leads such as 48 also connect in the usual manner with the electrical contact portions 24 along the bottom portion 18 of its respective circuit board 14.

The advantages of providing the circuit pack 12 comprising a plurality of circuit boards 14 which are fixed in permanent relationship to each other will be apparent from the highly versatile manner in which many elements may be supported and interconnected by printed circuitry, while elements and circuitry on one board 14 may be directly connected with circuitry on another board 14 of the same pack 12. The circuit pack 12 can thus be also designed to include a plurality of elements comprising an entire logical circuit without requiring various components of the same logical structure to be supported on separate and unconnected board members.

The direct interconnection of elements in the circuit pack, maintain its characteristic as a functional circuit allowing its operation to be checked even though the pack 12 does not have its electrical contact portions 24 engaged. The contact portions 24 may be utilized for connecting the circuit pack 12 with other circuit packs which will now be described in connection with FIGURES 1 to 4.

The circuit pack 12 may be interconnected with other circuit packs 12 or other electrical devices by having its bottom edge portion 18 (FIGURE 6) received in respective spaced parallel slots 50 of a connector unit 52 (FIGURE 1). The slots 50 extend through the top surface 51 of the connector unit 52. The connector unit 52, as illustrated, has four slots corresponding to the four board members 14 of the pack 12 which it engages. It is noted, however, that the number of board members 14 of the pack 12 and slots 50 of the connector 52 may vary according to design circumstances. A plurality of such connectors 52 may have their ends 54, 56 respectively secured with a pair of parallel supporting members 58, 60, by means of screws 62.

Each of the connecting units is provided with a plurality of electrical contact elements 64 (FIGURES 1 and 4) spaced within and along each of the grooves 50 for respectively engaging the contact portions 24 of the circuit boards 14 received within the slots 50 of the connector units 52. Each of the electrical contact elements 64 of the connector unit 52 is provided with an electrical connection shown by dashed lines at 66 (FIGURE 4) to a terminal 68 extending from the bottom surface 70 of the connector unit 52.

Figure 2:
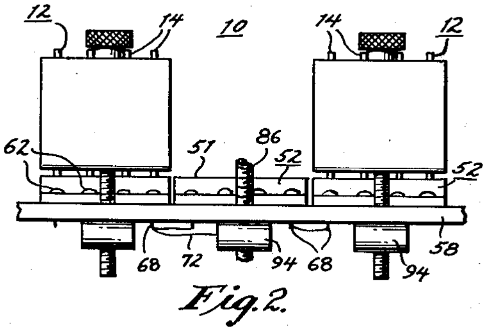
FIGURE 2 is a front elevational view of FIGURE 1.

The terminal 68 of any of the connector units 52 may be connected with other terminals 68 of other connector units mounted between the supporting members 58, 60 by means of conductors, as shown at 72 of FIGURE 2, along the bottom side of the connector units 52.

A clamping means is provided for engaging the end brackets 28, 30 of a circuit pack 12 and moving it into engagement, maintaining it in engagement and disengaging the bottom edge portions 18 of its board members 14 within respective grooves 50 of a connector unit 52. The clamping means comprises a pair of clamping assemblies 74, 76 (see FIGURE 4) each having a U-shaped bracket 78 with top and bottom horizontal leg portions 80, 82 for engaging the top and bottom outer surfaces of the leg portions of the retaining means 28, 30 of the pack 12. Each of the brackets 78 is provided with aligned openings 84 in its leg portions 80, 82 for receiving therethrough a bolt means 86. The end 88 of the bolt means 86 extends through an enlarged tapered opening 90 in the supporting members 58, 60 proximate the ends of the connector unit 52. The top end of each of the screw means 86 is provided with a knurled top portion 92 for rotating to threadedly engaging a pivot nut 94 at the end 88 of the bolt means 86 which extends through the opening 90.

Figure 3:
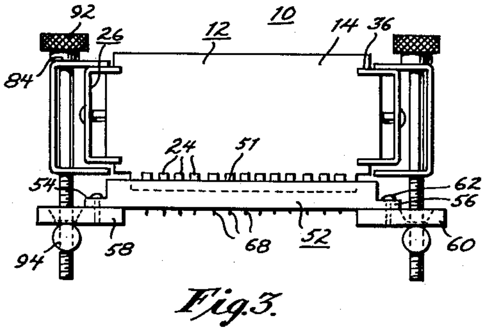
FIGURE 3 is a side elevational view of FIGURE 2.
Figure 4:
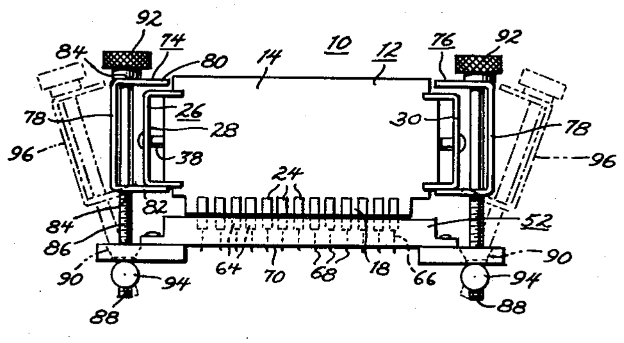
FIGURE 4 is similar to FIGURE 3 showing the circuit pack before it is inserted into the connector unit.

The enlarged opening 90 allows the bolt means 86 to pivot about the nut 94 to the position shown by the dashed lines at 96 of FIGURE 4. This provides a clearance for the positioning or removal of a pack 12 from its associated connector unit 52. After a pack 12 is positioned with the bottom end portions 18 proximate the respective openings or slots 50 of the connector unit 52, the clamping assemblies 74, 76 are pivoted to position shown by the solid lines (FIGURE 4) with the extending portions 80, 82 of their brackets 78 above and below the horizontal surfaces of the leg portions of the retaining means 28, 30 of the pack 12. The knurled portions 92 of the bolt means 86 may now be rotated in a clockwise direction while the nuts 94 are held against rotation by hand or by frictionally engaging the members 58, 60 for actuating the pack 12 into its engaged and contacting position with its connector unit 52. With the bolt means 86 screwed down tight, the pack 12 is securely maintained in its engaged position as shown in FIGURE 3. The pack 12 is thus maintained in position by the clamping means or may be sufficiently secured in some conventional manner so that the clamping means 74, 76 may be removed.

In order to remove the circuit pack 12 from its connector unit 52, the bolt means 86 are rotated in the counterclockwise direction so that the brackets 78 which are secured to move with the top portion 92 of the bolt means is caused to move upwardly jacking the pack 12 from its engaged position with its connector unit 52.

By this means a circuit pack 12 may be connected readily and efficiently maintained in position engaging its respective connector unit 52.

The many advantages of the circuit pack assembly are readily seen for providing an efficient means for supporting electrical components in assembled groups which may be handled as units and quickly replaced and interchanged, thereby, also providing a modular construction of high flexibility .

While this invention has been described and illustrated with reference to a specific embodiment, it is to be understood that the invention is capable of various modifications and applications, not departing essentially from the spirit thereof, which will become apparent to those skilled in the art.

What is claimed is:

1. A circuit pack assembly comprising a circuit pack having a plurality of circuit board members of substantially rectangular form each having first and second ends and top and bottom edges, at least several of said members having a plurality of electrical contact portions along their bottom edges, binding means comprising first and second retaining units respectively engaging the first and second ends of said members and including means extending between and securing together said retaining means; said binding means securing said members in a pack in spaced parallel relationship to one another; a connector unit provided with a plurality of parallel spaced grooves detachably receiving and retaining respective bottom edge portions of the members of said pack; the grooves of said connector unit having a plurality of electrical contact elements for engaging respective electrical contact portions of said members when the bottom edges of said members are received within respective grooves of said connector unit; said clamping means detachably connecting said pack and connector units; said clamping means removably engaging the binding means of said pack for moving into engagement, maintaining in engagement and disengaging said bottom edge portions with said connector unit within its said grooves; the first and second retaining units of said binding means being of U-shaped configuration having first and second plane leg portions engaging said members and providing substantially parallel top and bottom surfaces; said clamping means including first and second U-shaped brackets each having first and second plane leg portions disengageably contacting the leg portions of the retaining units of said pack; and a pair of bolt units having a top end engaging a respective one of said brackets and said bottom end engaging said connector unit.

2. The assembly of claim 1 in which said connector unit is provided with a pair of nut means pivotal with respect to said connector unit and threadedly engaging the respective bottom ends of said bolt units providing pivotal action of said bolt units for engaging and disengaging said retaining means with the binding means of said circuit pack; the top ends of said bolt units having handles for the rotation of said bolt units when said retaining means and binding means are engaged providing jacking action for moving into engagement, maintaining in engagement and disengaging the bottom edge portions of said members with said connector unit within its said grooves.

3. In a circuit pack assembly: a connector unit for detachably receiving and retaining the board members of a circuit pack together in a single pack, said connector unit being provided with a plurality of parallel spaced grooves containing electrical contact elements for detachably receiving and retaining electrical contact portions positioned on the bottom edge portions of said board members; and clamping means connected with said connector unit for detachably connecting said pack and said connector unit, said clamping means comprising a pair of U-shaped brackets connected at opposite sides of said connector unit, each said bracket having first and second leg portions for disengagingly contacting the opposite ends of said pack, and a pair of bolt units each having a top end engaging a respective one of said brackets and a bottom end engaging said connector unit.

4. The combination of claim 3 in which said connector unit is provided with a pair of nut means pivotal with respect to said connector unit and threadedly engaging the respective bottom ends of said bolt units providing pivotal action of said bolts for engaging and disengaging said retaining means with the ends of said pack; the top ends of said bolt units having handles for the rotation of said bolt units when said retaining means and binding means are engaged to provide jacking action for moving into engagement, maintaining in engagement and disengagement the bottom edge portions of said members with said connector unit within its said grooves.

5. A circuit pack comprising: a plurality of generally rectangular circuit boards, a pair of U-shaped channels, each said channel having in its legs a plurality of spaced, transverse slots, the slots in opposite legs being arranged in mutually aligned pairs, different pairs of the slots in one said channel engaging respectively one edge of different ones of said circuit boards, and different pairs of slots in the other said channel engaging respectively the opposite edge of said different circuit boards.

6. The apparatus of claim 5 further comprising means urging said channels toward each other, thereby exerting a clamping effect on said slot-engaged circuit boards.

7. The apparatus of claim 5 further comprising a pair of U-shaped clamping means, respectively clasping different ones of said U-shaped channel means, and means for reciprocably displacing said clamping means transversely to the longitudinal dimensions of said channel means.

8. The apparatus of claim 7 further comprising first electrical connector means disposed along an edge of each said circuit boards perpendicular to those engaged by said U-shaped channels, second electrical connector means disposed adjacent said perpendicular edges of said circuit boards, and means coupling said displacing means to said connector receiving means so that displacement of said clamping means by said displacing means displaces said first connector means reciprocably toward and away from said second connector means.

References Cited in the file of this patent

UNITED STATES PATENTS

| | | |
|---|---|---|
| 2,701,346 | Powell | Feb. 1, 1955 |
| 2,748,321 | Kamm | May 29, 1956 |
| 2,823,360 | Jones | Feb. 11, 1958 |
| 2,832,013 | Pedersen | Apr. 22, 1958 |
| 2,834,922 | Selgin | May 13, 1958 |
| 2,836,772 | Wintrobe | May 27, 1958 |
| 2,894,077 | McCoy | July 7, 1959 |
| 2,925,537 | Winkler | Feb. 16, 1960 |
| 2,931,003 | Huetten | Mar. 29, 1960 |

OTHER REFERENCES

Formica Publication, 1954, pages 1 to 7.

Bell Laboratory Record, April 7, 1958, pages 117–121.